United States Patent

[11] 3,573,567

[72] Inventors Robert L. Harris
North Scituate;
Joseph P. Stefani, Warwick, R.I.
[21] Appl. No. 814,246
[22] Filed Apr. 8, 1969
[45] Patented Apr. 6, 1971
[73] Assignee General Electric Company

[54] SOLID-STATE SWITCH HOUSING
1 Claim, 5 Drawing Figs.

[52] U.S. Cl. .......... 317/234, 317/242
[51] Int. Cl. .......... H01l 1/06
[50] Field of Search .......... 317/234, 235; 317/234.4

[56] References Cited

UNITED STATES PATENTS

| | | | |
|---|---|---|---|
| 2,945,992 | 7/1960 | Ballert et al. | 317/234 |
| 2,981,873 | 4/1961 | Eannarino et al. | 317/234 |
| 3,375,415 | 3/1968 | Finn | 317/234 |
| 3,409,808 | 11/1968 | Diebold | 317/234 |
| 3,441,813 | 4/1969 | Takatsuka et al. | 317/234 |

*Primary Examiner*—James D. Kallam
*Attorneys*—Paul E. Rochford, Frank L. Neuhauser and Oscar B. Waddell

ABSTRACT: The present invention relates to a solid-state switch housing and heat sink. More particularly it provides a heat sink which is readily mountable to a larger heat sink and in an insulating enclosure which provides a relatively long electrical path between the switch and the heat sink as compared to the heat transfer path from the switch to the heat sink.

INVENTORS
ROBERT L. HARRIS,
JOSEPH P. STEFANI
BY Paul E. Rochford
ATTORNEY

SOLID-STATE SWITCH HOUSING

The present invention relates to the insulative mounting of a solid-state switching element to provide a short heat conductive path and a long over surface electrical insulation path to a metal heat sink.

In the use of solid-state switches in apparatus used for variable power control it is necessary to provide means for dissipating heat produced within the solid-state device itself. Desirably the device is mounted proximate a heat sink. However, most heat sinks to be effective are formed of metal. At the same time the solid-state device carries electric power at a voltage and amperage level at which the electric power controlled by the solid-state switch is supplied. Thus the close spacial proximity of solid-state switch and metal heat sink are highly desirable for heat transfer purposes and yet are undesirable from the point of view of electrical insulation. One solution has been separation of the solid-state device and heat sink by an insulator having a high heat transfer capability.

In prior art devices the insulating separator chosen has been selected primarily on the basis of high insulating capacity in thin sections of the material. For example thin strips of polyester film have been employed. One problem with this type of construction is that a wide apron of the sheet must be extended around the solid-state device to provide an extent of over surface insulation between current carrying portions of the device and the heat sink which normally carries no current. The requirement for over surface insulation is based on safety considerations relating to keeping current carrying parts effectively separated from structural metal parts and is applied in standards established by Underwriters' Laboratories. Currently Underwirters' Laboratories requires at least one-half inch of over surface insulation between an exposed power carrying element at above 51 volts, and accordingly at standard line voltage such as 125 volts, and a conductive structural element of or attached to a device.

Another problem which exists in prior art devices is that of replacing the solid-state element when it is damaged by electrical, thermal or other phenomena. The mounting of such devices is frequently by means of cements or other semipermanent means which requires attack on or disruption of the heat sink with which they are associated for normal usage so that damage occurs when they are demounted or replaced.

A further problem of prior art devices is that the heat dissipation is limited in its transfer from a primary heat sink to a secondary heat sink due to limited heat transfer between the two heat sinks. Use of primary and secondary heat sinks is made to facilitate the replacement of the solid-state switch.

Accordingly conflicting criteria are at play in the use of a primary or intermediate heat sink in that use of an intermediate does facilitate replacement of the solid-state switch, but it also has the drawback of reducing transfer of heat to the main or ultimate heat sink.

It is accordingly one object of the present invention to provide a housing for an intermediate heat sink for a solid state switch of high heat transfer capability.

Another object of the present invention is to provide a housing for a solid-state switch having a combination of a short heat transfer path and a long oversurface insulation path.

It is a further object of the present invention to provide a housing for a solid-state switch which is readily demountable from a heat sink with which it is associated.

Additional objects and advantages will be in part apparent and in part pointed out in the description which follows.

In one of its broader aspects the objects of the invention are carried out by providing a base of a heat conductive material having a heat-receiving surface and an oppositely extending attachment means for mounting said base to a heat sink, an insulating ceramic wafer of high heat conductivity mounted on said heat receiving surface, said wafer having insulating edges, a solid-state switch mounted on said wafer in heat delivering relation thereo, an insulating collar in insulating contact with the insulating edges of said wafer and extending up from said heat-receiving surface, said collar forming with said wafer an insulating cup, and electrical conductors from said solid-state switch extending up through the interior of said cup.

The description of the invention and the manner in which it may be carried into effect will be aided by reference to the accompanying drawing in which.

Figure 1:
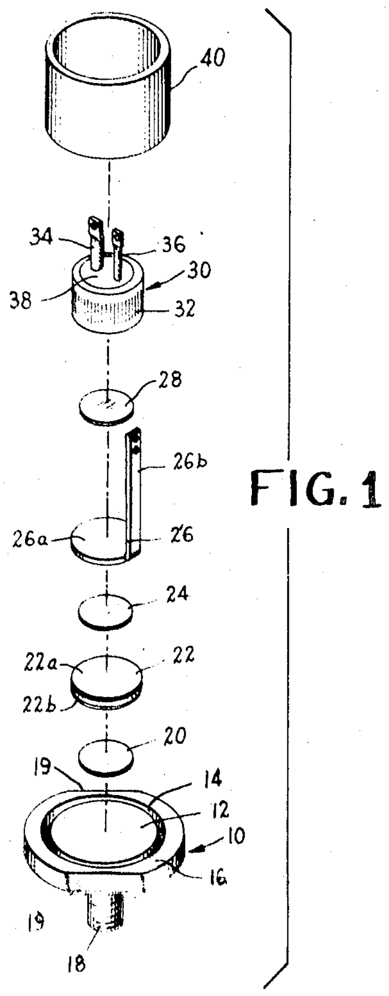
FIG. 1 is an exploded perspective view of the component parts of a solid state switch and housing.

Referring first to FIG. 1, a metal base 10 is seen to have a receiving inner surface 12, an annular channel 14, and a rim 16 at its perimeter. A threaded stud 18 is formed at its lower end.

A disc 20 of solder or similar highly heat conductive adhesive materilal is disposed above the base 10 between the receiving surface 12 to which it is bonded and the insulating wafer 22. The wafer may be of a high heat conductivity ceramic material such as beryllium oxide and is preferably coated with metal at its upper *22a* and lower *22b* surfaces to facilitate adhesion of solder or other bonding material of high heat conductivity.

A disc 24 of solder similar to disc 20 is shown disposed between the upper surface *22a* of insulator wafer 22 and the terminal strap 26. The disc 24 serves a bondin g function similar to disc 20 and is fused into place to bond strap 26 to wafer 22 in good heat transfer relationship.

The terminal strap 26 comprises a lower metal disc 26i a having a diameter approximately equivalent to that of wafer 22 and an upwardly extending conductor strip 26i b having a wire receiving terminal at its upper end.

A third disc 28 of solder similar to discs 20 and 24 is shown disposed between the upper surface of disc *26a* and the undersurface of can 32 of solid state switch 30. The can 32 constitutes a power terminal of the switch, the larger electrode 34 serving as the other power electrode.

A trigger electrode 36 is seen to emerge from the can 32 through an insulating closure 38.

An insulating collar or ring 40 which be of fiber, cardboard, plastic, or the like constitutes a vertical outer wall of the switch container or cup. The function of the vertical wall is best seen and described with reference to FIG. 2. In this FIG. the elements of FIG. 1 are seen partially in section in assembled disposition. An insulating or potting layer 44 is formed between the outer vertical wall 40 and the switch 30 and accessory parts. This layer 44 may be formed by introducing a potting compound in a liquid, paste or fused form into the space between the outer surface of the switch 30 and the inner surface of the collar 40. A curable composition such as a silicone rubber which cures at room temperature is highly satisfactory.

One factor which contributes to the success of the potting compound in forming an insulating barrier between the switch can 32 and attached strap 26 is the close conforming of the potting compound to all internal surfaces of the structure including the insulating edge surface of wafer 22. The potting compound must form an insulating separator which tightly conforms all around the insulating edge of the wafer to provide electrical separation between the disc 26i a and the receiving surface 12 of the base.

Once the insulation is in place the switch is in close thermal contact with the base 10 but there is a much longer over surface insulating path between the electrodes 34, 36 and 26i b and the base 10. The heat is accordingly efficiently transferred to the base 10 although there is a substantial over surface insulating barrier between the switch 30 and the base 10.

Heat is also efficiently transferred between the base 10 and the larger heat sink 42 because of the intimate thermal contact existing along the interface between base 10 and heat sink 42. The path extends along the threaded surface between threaded stud 18 and the internally threaded hole 46 of the heat sink 42. But in addition because the base 10 can be tightly threaded to the base 42 an intimate thermal path exists at the upper surface 48 of heat sink 42 and the lower surface 13 of the base 10.

Flat faces 19 on base 10 facilitate tightening the base to the heat sink 42.

Figures 3, 4:
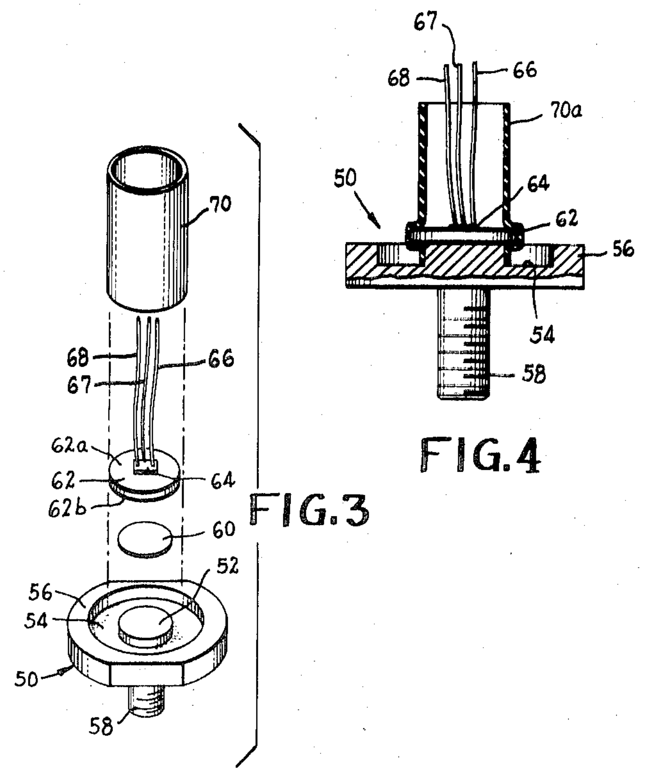
FIG. 3 is an exploded view of an alternative form of the solid state switch of the present invention.
FIG. 4 is a vertical section of the assembled form of the switch of FIG. 3.

Turning now to FIGS. 3 and 4 an alternative form of the device of the present invention is seen in exploded view in FIG. 3 and partly in section in assembled form in FIG. 4.

Referring first to FIG. 3, a base 50 corresponding to base 10 of FIG. 1 is formed to have a receiving inner surface 52, an annular channel 54, a rim 56 at its perimeter.

A disc 60 of solder or similar fusible bonding material having 7the approximate diameter of the receiving surface 52 is disposed between the surface 52 and the insulating wafer 62 and is employed to bond the metal coated under surface **62*b* of wafer 62 to surface 52**.

The wafer 62 also has a metal coated upper surface but has a nonconductive or insulating edge surface.

A solid-state switch 64 illustrated as a generally rectangular chip is shown bonded to the upper surface of the insulating wafer. Two insulated electric power leads 66 and 68 are shown attached at their lower ends to chip 64. A third trigger lead 67 is also shown attached to chip 64.

A shrink collar 70 having an initial inner diameter greater than the outer diameter of wafer 62 is shown posed above the array of elements of the switch and base.

In forming this modification of the device of this invention the wafer bearing this switch is first soldered to the receiving surface. The unheated shrink tube is then placed over the wafer and inserted into trough 54. Heat is then applied to the assembly to shrink tube 70 into the configuration shown in FIG. 4.

In this configuration the tube is compressed tightly against the insulating edge walls of the wafer and forms with the wafer an insulating cup for the solid-state switch.

As used herein the term cup means a container for electrical conductors and solid-state switch where the switch is located against the inner bottom surface of the container and electrical leads to and from the solid-state switch extend up and away from the bottom of the container and are at least laterally surrounded by the insulating walls of said container. The container sidewalls need not stand independently spaced from the conductors but may conform to the conductors. In fact the sidewalls may be formed of an insulating potting or similar compound such as epoxy compound or silicone rubber or other insulator which is put in place in liquid, paste, powder, or fused form and then "set" so as to be self-supporting. Further the conductors need not be insulated only by the sidewalls of the container but may have individual sheath or surface adherent insulation thereon. Moreover the container need not be empty but may be filled or partially filled or capped with a potting or similar compound.

Figure 5:
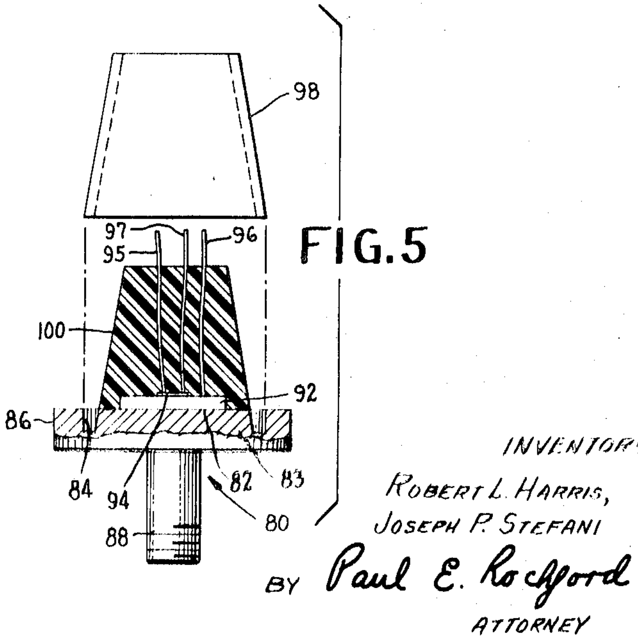
FIG. 5 is a vertical section of a further alternative form of the switch of the present invention.

Turning now to FIG. 5 another alternative form of the device of the present invention is shown. In this form a potting compound forms the sidewalls of the cup.

Startig with the base 80 it is seen that it comprises a receiving surface 82 which forms the upper surface of a pedestal or platform 83, an annular groove 84 and an outer rim 86. Extending downward from base 80 is threaded stud 88.

Figure 2:
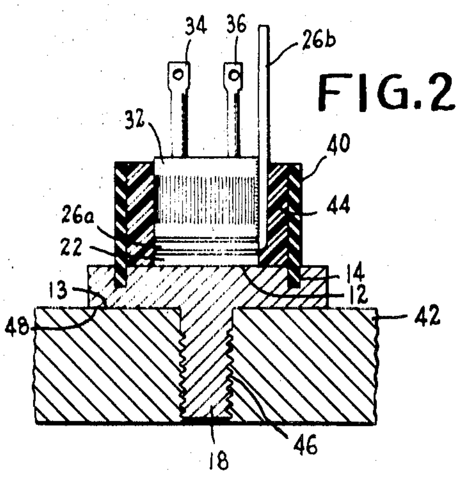
FIG. 2 is a vertical sectional view through the assembled device of FIG. 1.

An insulating wafer 92 is bonded to the receiving surface 82 as by a solder or other bonding agent of high heat conductivity. The wafer 92, as wafer 62 of FIGS. 3 and 4 or wafer 22 of FIGS. 1 and 2, is of a ceramic or similar insulating material of high heat conductivity. The upper and lower surfaces of the wafer may be metal-coated to facilitate adherence of solder or similar bonding agent.

A solid state chip 94 which may be that of an SCR OR OF A TRIAC, QUADRAC OR A CHIP OF A SIMILAR SOLID STATE DEVICE IS DISPOSED PROXIMATE THE INSULATING HEAT TRANSFER WAFER (0 SO AS TO OPTIMIZE TRANSFER OF HEAT TO THE BASE *).

One electrode of the solid state chip may be a conducting surface on the heat transfer wafer 92 and a conducting lead 96 is shown connected to this surface.

Other electrodes of the chip 94 have additional conducting leads 95 and 97 connected thereto as well.

The wafer chip and electric leads are potted as by puring or forcing a liquid or paste into a mold form 98 shown posed above the base in a position to which it would be removed following the potting of the compound 100 around and about the elements of the solid-state switch.

In other words after the wafer, the solid-state switch and electric leads are assembled and prior to the ppotting, the mold form, or inverted funnel shaped collar 98, is inserted into place in the groove 84. Potting compound which may be conventional molten resin or a curable material as described above is then introduced into the mold cavity to enclose the assembled parts and particularly to form with the wafer an insulating cup extending up from the base 80. The formation of the insulating cup depends in part on forming an insulating interface between the insulating edges of the wafer 92 and the potting compound 100 which contacts it and also depends on forming insulating walls extending up from the interface and accordingly providing a long oversurface insulating path from the base to the conductor emerging from the cup.

Other modifications of the invention will be apparent based on the above teaching to those familiar with this art.

We claim:

1. A solid-state switch mounting which comprises:
   - a base of an electrically conductive and heat conductive material said base having a heat-receiving surface and an oppositely extending attachment means for mounting said base to a heat sink;
   - an electrically insulating ceramic wafer of high heat conductivity mounted on said heat-receiving surface;
   - said wafer having an electrically nonconducting surface at least at the edge portion;
   - a solid-state switch mounted on said wafer in heat delivering relation thereto;
   - an electrically insulating collar in contact with said nonconducting edges portion of said wafer and extending up from said heat receiving surface;
   - said collar forming with said wafer an insulating cup;
   - electrical conductors from said solid-state switch extending up through said cup; and the oversurface electrically insulating path from an exposed portion of said upwardly extending conductors to said base being longer relative to the heat conductive path between the solid-state switch and the base.